United States Patent
Chen et al.

(10) Patent No.: US 6,798,364 B2
(45) Date of Patent: Sep. 28, 2004

(54) METHOD AND APPARATUS FOR VARIABLE LENGTH CODING

(75) Inventors: Yen-Kuang Chen, Sunnyvale, CA (US); Matthew J. Holliman, Sunnyvale, CA (US); Herbert Hum, Portland, OR (US); Per H. Hammarlund, Hillsboro, OR (US); Thomas Huff, Portland, OR (US); William W. Macy, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 192 days.

(21) Appl. No.: 10/068,050

(22) Filed: Feb. 5, 2002

(65) Prior Publication Data

US 2003/0146858 A1 Aug. 7, 2003

(51) Int. Cl.[7] ................................................ H03M 7/40
(52) U.S. Cl. ................................ 341/67; 375/240.23
(58) Field of Search .......................... 341/63, 65, 67; 708/210, 211; 375/240.23

(56) References Cited

U.S. PATENT DOCUMENTS

| | | | | |
|---|---|---|---|---|
| 3,678,259 A | * | 7/1972 | Kyser | 708/211 |
| 5,818,363 A | * | 10/1998 | Kim | 341/63 |
| RE37,507 E | * | 1/2002 | Jung | 341/63 |
| 6,516,330 B1 | * | 2/2003 | Hicks et al. | 708/210 |
| 6,529,554 B1 | * | 3/2003 | Craver | 375/240.23 |

FOREIGN PATENT DOCUMENTS

| EP | 0 724 215 A1 | 7/1996 |
|---|---|---|
| WO | WO 00/59116 | 10/2000 |

OTHER PUBLICATIONS

John Watkinson, Compression in Video & Audio, 1995, Chapter 3, Processing for Compression, pp. 61–102, Chapter 5, Video Compression, pp. 128–169, Focal Press, An imprint of Butterworth–Heinemann Ltd., Linacre House, Jordan Hill, Oxford OX2 8DP.

Christian Huitema & Thierry Turletti, Software Codecs and Works Station Video Conferences, INRIA, Sophia–Antipolis, France, Nov. 22, 1993, pp. 1–8.

ITU–T, Telecommunication Standardization Sector of ITU, H.263, Series H: Audiovisual and Multimedia Systems; Infrastructure of Audiovisual Services–Coding of Moving Video; Video coding for low bit rate communication, Feb. 1998, pp. 1–167.

Search Report for PCT/US 03/02375, mailed Jul. 1, 2003, 2 pages.

Drost, G,W, et al., A hybrid system for real–time lossless image compression, Microprocessors and Microsystems, IPC Business Press Ltd., London, GB, vol. 25, No. 1, Mar. 15, 2001, pp. 19–31.

Nguyen–Phi, K. et al., Image compression using bit–plane coding of wavelet coeffiencients, Electronics Letters, Sep. 12, 1996, vol. 32, No. 19, pp. 1773–1775.

Zandi, Ahmad, et al., Optimizing Bit–Plane Context–Dependent Entropy Coding For Palettized Images, IEEE International conference on image processing 1995, pp. 270–273.

* cited by examiner

Primary Examiner—Howard L. Williams
(74) Attorney, Agent, or Firm—Blakely, Sokoloff, Taylor & Zafman LLP

(57) ABSTRACT

A method and apparatus for variable length coding is described. A method comprises receiving a group of data having a group of set values, identifying a group of positions of the group of set values within the group of data without branching, for each of the group of positions, encoding a run of non-set values preceding each of the group of positions.

30 Claims, 10 Drawing Sheets

METHOD AND APPARATUS FOR VARIABLE LENGTH CODING

BACKGROUND OF THE INVENTION

1. Field of the Invention

The invention relates to the field of data processing. More specifically, the invention relates to encoding.

2. Background of the Invention

In a traditional communications system, an encoder compresses a signal into a bit rate that is less than, and close to, a channel capacity. An example signal is a video signal. A video encoder compresses the video signal for transmission over a channel. A decoder receives the compressed video signal and reconstructs the video signal using all bits received from the channel. In such a model, two basic assumptions are made: 1) the encoder knows the channel capacity, and 2) the decoder is able to decode all bits received from the channel fast enough to reconstruct the video. These two basic assumptions are challenges in Internet streaming video applications.

In MPEG-2 and MPEG-4, several layered scalability techniques, namely, SNR scalability, temporal scalability, and spatial scalability, have been included. In such a layered scalable coding technique, a video sequence is coded into a base layer and an enhancement layer. The enhancement layer enhances the quality of video when received and decoded.

In MPEG-4 Fine-Granularity Scalability (FGS), the enhancement layer is encoded using bit-plane coding. An image is composed of a two-dimensional array of picture elements called pixels. Pixel values may be represented in base-2 using bits. Bits in a pixel value vary in their significance. The first bit is the 1's place, the second is the 2's place, the third is the 4's place, etc. In most cases 8 bits describe pixel value so the eighth bit is 128's place. An image or a video may be divided into a two-dimensional array represented by value bits at a particular bit position in the pixel value. The two-dimensional array is called a bit-plane because a single bit represents each pixel. The approach to compressing a bit-plane is to encode the run length of the number of zeros between each one.

In run length encoding, non-zero values are located first. The 0's between non-zero values are then counted and the number of 0's along with the non-zero data is encoded. In some implementations, each value is individually tested with a conditional operation. Each time a non-zero value is extracted, a mispredicted branch results because of the conditional operation. Branch misprediction decreases pipeline efficiency and slows down a processor. The slowdown of the processor becomes more pronounced as the processor's pipeline length increases.

BRIEF DESCRIPTION OF THE DRAWINGS

The invention may best be understood by referring to the following description and accompanying drawings that are used to illustrate embodiments of the invention. In the drawings.

DETAILED DESCRIPTION OF THE DRAWINGS

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

Figure 1:
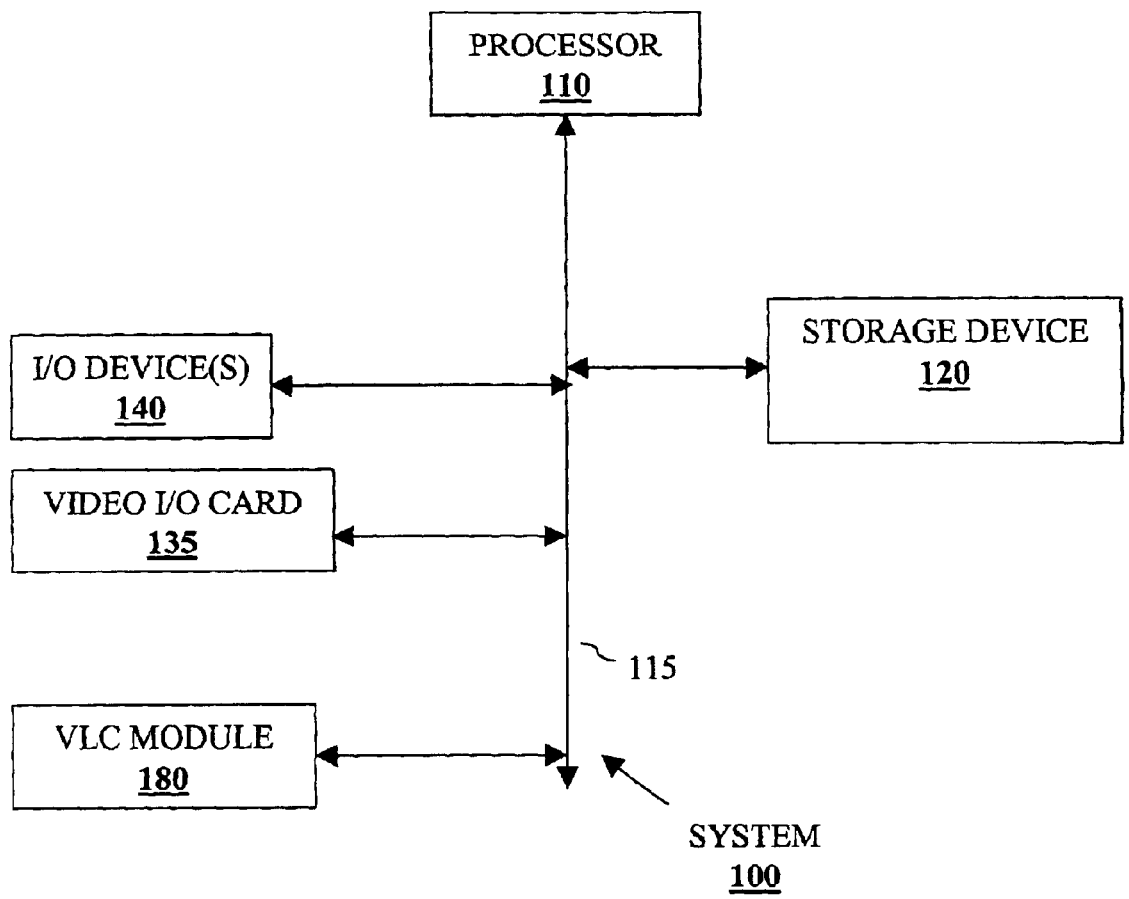
FIG. 1 is a block diagram illustrating one embodiment of a computer system 100 in accordance with one embodiment of the invention.

FIG. 1 is a block diagram illustrating one embodiment of a computer system 100 in accordance with one embodiment of the invention. The computer system 100 comprises a processor 110, a storage device 120, and a bus 115. The processor 110 is coupled to the storage device 120 by the bus 115. In addition, a number of user input/output devices 140 (e.g., keyboard, mouse) are also coupled to the bus 115. The processor 110 represents a central processing unit of any type of architecture, such as CISC, RISC, VLIW, or hybrid architecture. Furthermore, the processor 110 could be implemented on one or more chips. The bus 115 represents one or more buses (e.g., AGP, PCI, ISA, X-Bus, VESA, etc.) and bridges. While this embodiment is described in relation to a single processor computer system, the invention could be implemented in a multi-processor computer system.

In addition to other devices, one or more of a video input/output card 135 may optionally be coupled to the bus 115. The storage device 120 represents one or more machine-readable media. Thus, a machine-readable medium includes any mechanism that provides (i.e., stores and/or transmits) information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.), etc.

The video input/output card 135 represents one or more devices for digitizing images, capturing images, capturing video, transmitting video, etc.

The system 100 also includes a variable length coding (VLC) module 180. The VLC module 180 may be different types of hardware (such as digital logic) executing the processing described herein (which is described in more detail below). Although the VLC module 180 is illustrated as coupled with the processor 110 via the bus 115, the VLC module 180 may be implemented as circuitry and/or instructions within the processor in alternative embodiments of the invention. The VLC module 180 may be included on the video input/output card 135 as circuitry and/or instructions in other embodiments. Alternative embodiments of the present invention may implement the VLC module as code in the storage device 120.

Figure 2A:
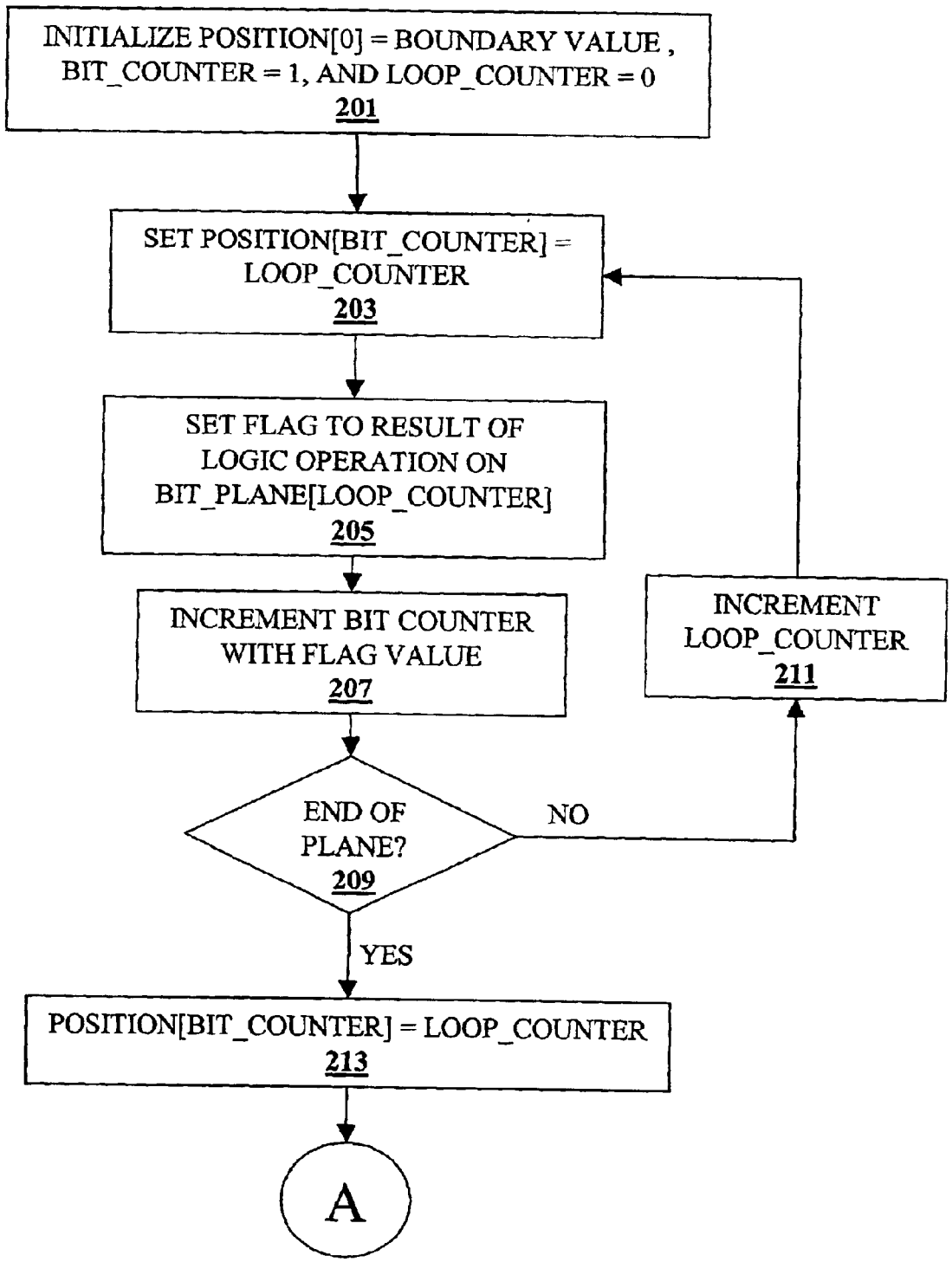
FIG. 2A is a flowchart for bit plane extraction according to one embodiment of the invention.

FIG. 2A is a flowchart for bit plane extraction according to one embodiment of the invention. At block 201, the VLC module 180 initializes POSITION [0] to a boundary value (e.g., −1). Also at block 201, the VLC module 180 initializes a loop counter ("LOOP_COUNTER") to 0 and initializes a bit counter ("BIT_COUNTER") to 1. At block 203, the VLC module 180 sets POSITION [BIT_COUNTER] to LOOP_COUNTER. At block 205, a flag is set to the result of a logic operation on BIT_PLANE [LOOP_COUNTER]. An example of the logic operation would be the following: ((BIT_PLANE [LOOP_COUNTER] & BIT_MASK)||0).

At block 207, the VLC module 180 increments BIT_COUNTER with the flag. At block 209, the VLC module 180 determines if it has reached the end of the bit plane. If the VLC module 180 determines that is has not reached the end of the bit plane, then at block 211 the VLC module 180 increments LOOP_COUNTER. From block 211 control flows to block 203. If at block 209 the VLC module 180 determines that it has reached the end of the bit plane, then the VLC module 180 sets POSITION [BIT_COUNTER] to LOOP_COUNTER at block 213. From block 213 control flows to block 215.

Figure 2B:
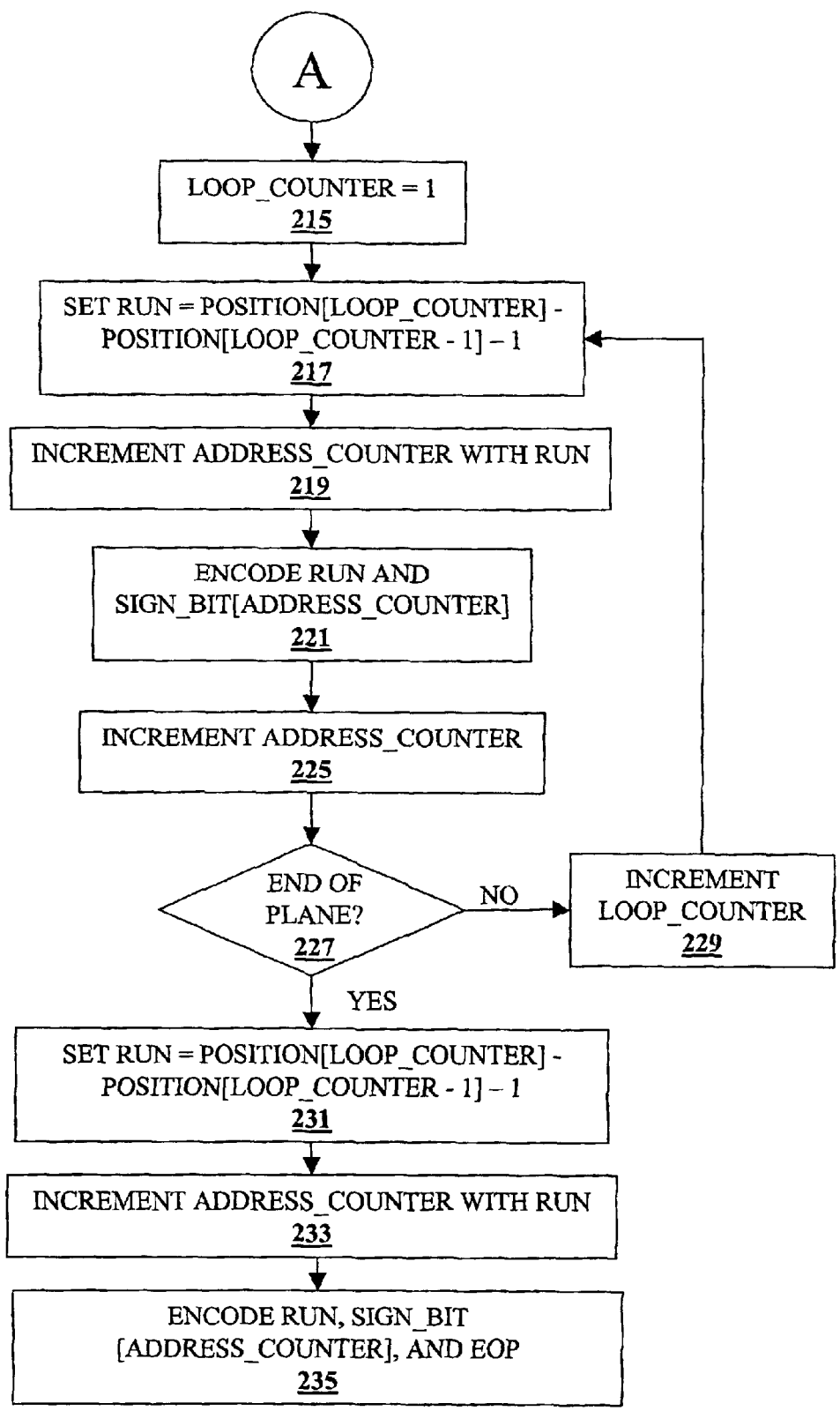
FIG. 2B is a flow chart for variable length coding of a bit plane according to one embodiment of the invention.

FIG. 2B is a flow chart for variable length coding of a bit plane according to one embodiment of the invention. At block 215, the VLC module 180 sets LOOP_COUNTER to 1. At block 217, the VLC module 180 sets a variable indicating a run of bits ("RUN") to the result of the following operation:

POSITION [LOOP_COUNTER]-POSITION [LOOP_COUNTER−1]−1.

At block 219, the VLC module 180 increments a variable indicating current location within the bit plane ("ADDRESS_COUNTER") with RUN. At block 221, the VLC module 180 calls an encoding procedure and passes RUN, sign bits for the bit plane ("SIGN_BIT"), and ADDRESS_COUNTER as parameters. The encoding procedure encodes the bits of the bit plane up to the position indicated by ADDRESS_COUNTER and, when necessary, the corresponding sign bit(s). In one embodiment, an array of values (represented by individual bits or multiple bits) indicate whether it is necessary to encode the sign bit(s).

At block 225, the VLC module 180 increments ADDRESS_COUNTER. At block 227, the VLC module 180 determines if it has reached the end of the bit plane. For this illustration, a significant bit (or called, a set bit) is a non-zero value bit. Alternative embodiments of the invention may encode runs of non-zero value bits and track positions of zero value bits as significant bits. In another embodiment, runs of certain value represented by multiple bits (e.g., a byte) may be encoded while positions of other values represented by multiple bits are tracked. If the VLC module 180 determines that it has not reached the last position with a significant bit in the bit plane, then at block 229 the VLC module 180 increments LOOP_COUNTER. From block 229 control flows to block 217. If at block 227 the VLC module 180 determines that it has reached the final position in the bit plane with a significant bit, then at block 231 the VLC module 180 sets RUN to the result of the following operation:

POSITION [LOOP_COUNTER]-POSITION [LOOP_COUNTER−1]−1.

At block 233, the VLC module 180 increments ADDRESS_COUNTER with RUN. At block 235, the VLC module 180 calls the encoding procedure and passes RUN, SIGN_BIT[ADDRESS_COUNTER], and an ending symbol as parameters. The ending symbol may be one or more bits to indicate end of the bit plane. The encoding procedure encodes the bits of the bit plane after the last significant bit up to the EOP bit and, when necessary, the corresponding sign bit(s).

The described invention enables variable length coding without non-loop related conditional branches. Removing non-loop related conditional braches dramatically reduces the number of mispredicted branches that occur while performing variable length coding. Reducing mispredicted branches in variable length coding increases the speed of variable length coding and increases efficiency of an associated processor, such as processor 110.

Figure 3:
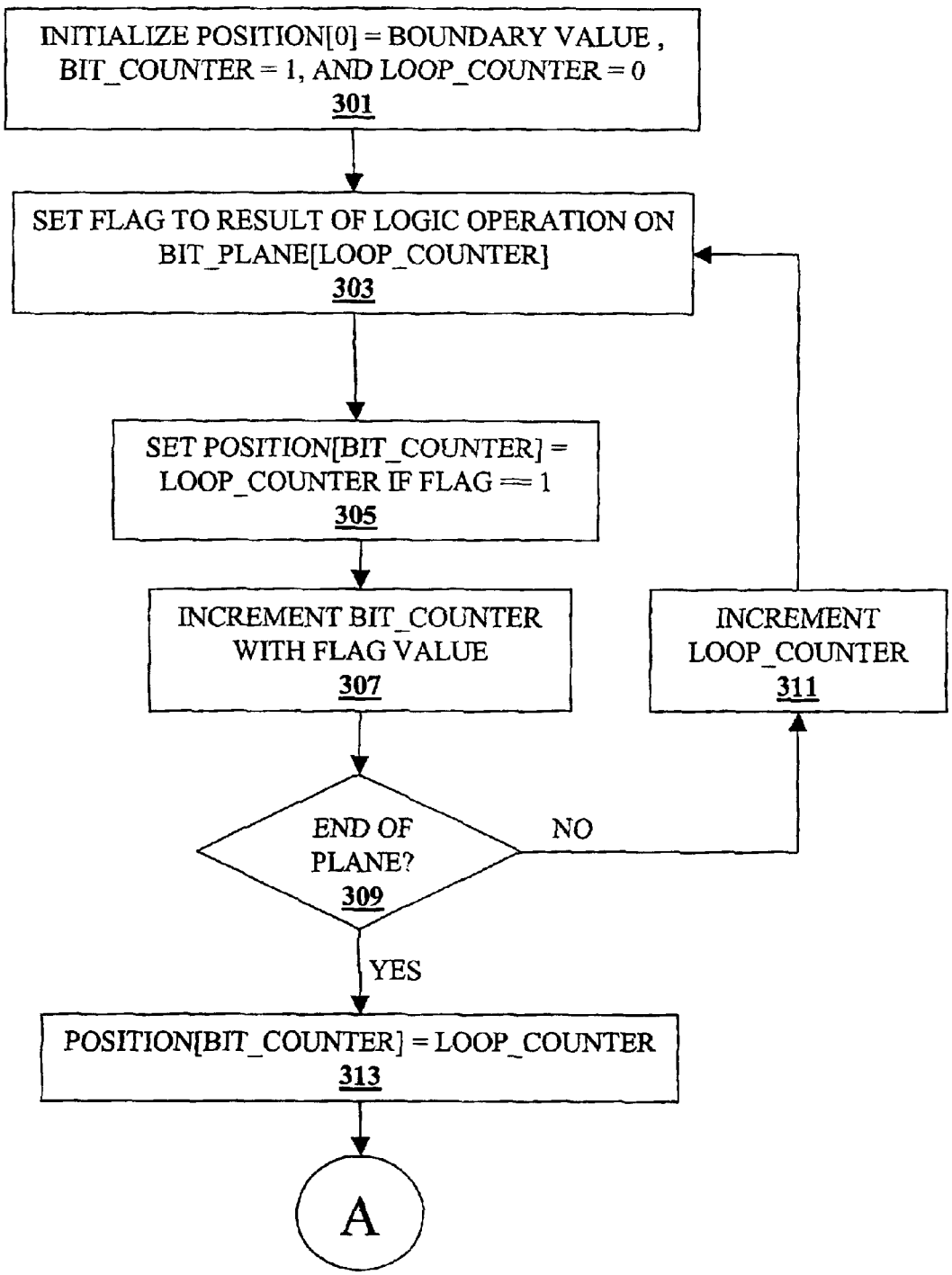
FIG. 3 is a flow chart for bit plane extraction according to another embodiment of the invention.

FIG. 3 is a flow chart for bit plane extraction according to another embodiment of the invention. At block 301, the VLC module 180 initializes POSITION[0], BIT_COUNTER and LOOP_COUNTER. The VLC module 180 initializes POSITION[0] to a boundary value (e.g., −1). The VLC module 180 initializes BIT_COUNTER to 1 and LOOP_COUNTER to 0 as in block 201 of FIG. 2A. At block 303, the VLC module 180 sets a flag to the result of a logic operation on BIT_PLANE [LOOP_COUNTER]. An example logic operation would be the following: ((BIT_PLANE [LOOP_COUNTER] & BIT_MASK)||0). Block 303 is similar to block 205 of FIG. 2A.

At block 305, the VLC module 180 sets POSITION [BIT_COUNTER] to LOOP_COUNTER if the flag has been set to 1. Block 305 may be implemented with a predicate instruction or a conditional move instruction. At block 307, the VLC module 180 increments BIT_COUNTER with the flag. At block 309, the VLC module 180 determines if it has reached the end of the bit plane. If the VLC module 180 determines that it has not reached the end of the bit plane, then at block 311 the VLC module 180 increments LOOP_COUNTER. Control flows from block 311 to block 303. If at block 309 the VLC module 180 determines that it has reached the end of the bit plane, then at block 313 the VLC module 180 sets POSITION[BIT_COUNTER] to LOOP_COUNTER. Control flows from block 313 to block 215 of FIG. 2B.

FIGS. 2A–2B and FIG. 3 illustrate embodiments of the invention at a source code level. Alternative embodiments of the invention may be implemented at a lower level.

Figure 4:
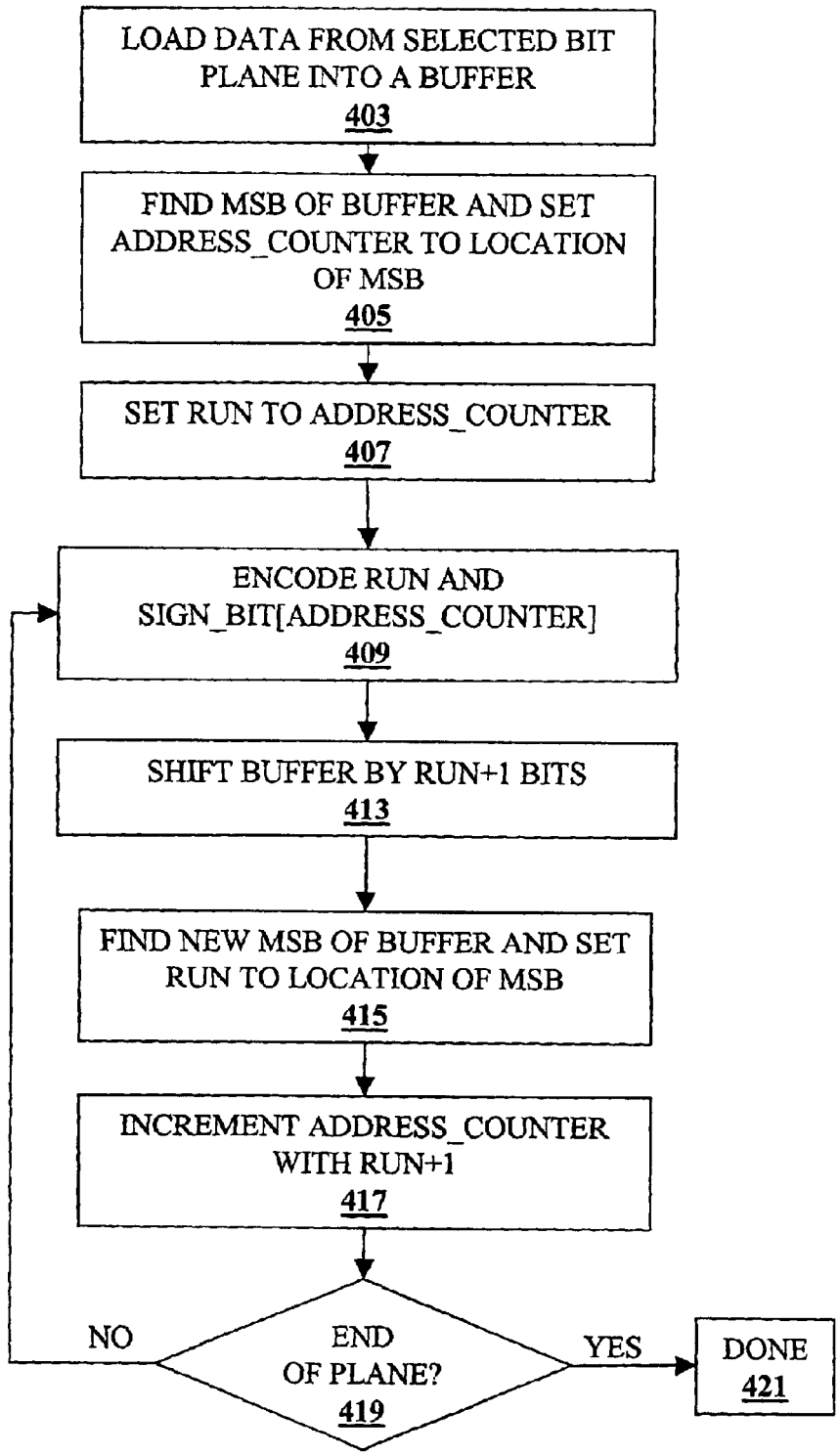
FIG. 4 is a flow chart for another embodiment of variable length coding according to one embodiment of the invention.

FIG. 4 is a flow chart for another embodiment of variable length coding according to one embodiment of the invention. At block 403, the VLC module 180 loads a selected bit plane into a buffer. At block 405, the VLC module 180 finds the position of the most significant set bit (MSB, or the first set bit) of the buffer and sets a variable ADDRESS_COUNTER to the location of the MSB. At block 407, the VLC module 180 sets RUN to ADDRESS_COUNTER. At block 409, the VLC module 180 encodes bits up to the position indicated by RUN in the buffer and their corresponding sign bits, which may be stored in another buffer. At block 413, the VLC module 180 shifts the buffer by RUN+1 bits. At block 415, the VLC module 180 finds the position of a new MSB in the buffer and sets RUN to the position. At block 417, the VLC module 180 increments ADDRESS_COUNTER with RUN+1. At block 419, the VLC module 180 determines if it has reached the end of the bit plane. If the VLC module 180 determines that it has not reached the end of the bit plane, then control flows to block 409. If at block 419 the VLC module 180 determines that it has reached the end of the bit plane, then at block 421 the VLC module is done performing variable length coding of the selected bit plane.

Figure 5:
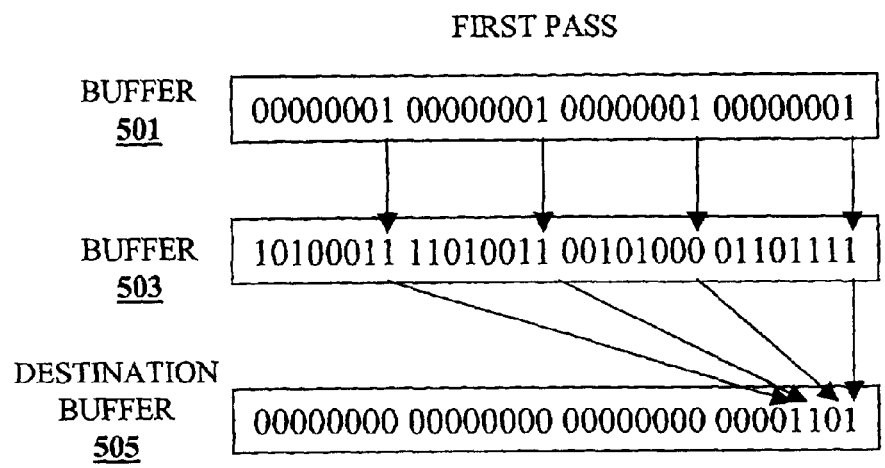
FIG. 5 is a block diagram illustrating exemplary extraction of a selected bit plane into a buffer as described in block 403 of FIG. 4 according to one embodiment of the invention.

FIG. 5 is a block diagram illustrating exemplary extraction of a selected bit plane into a buffer as described in block 403 of FIG. 4 according to one embodiment of the invention. In FIG. 5, masking bits are stored in a buffer 501. The masking bits in the buffer 501 are set in accordance with a certain bit plane. Data bits from a data stream ("source data") are stored in a buffer 503. In the example illustrated in FIG. 5, the first bit in each byte of the source data corresponds to a particular bit plane. If this particular bit plane is a desired bit plane, then the first bit of each byte in the buffer 501 is set to 1. Each masking bit in the buffer 501 selects a corresponding data bit in the buffer 503. The selected bits are stored in a destination buffer 505 as the 4 rightmost bits of the destination buffer 505. All remaining locations of the destination buffer 505 that have not been set are then set to 0. The buffers 501, 503, and 505 may be implemented as one or a combination of RAM, optical storage, magnetic storage, a register, etc.

In one embodiment, a bit plane is extracted from a source data in multiple passes. The masking bits of the buffer 501 are used to select corresponding bits from the source data in the multiple passes. Various embodiments of the invention may extract bits with shift and logic operations differently. In one embodiment, the destination buffer is shifted and the selected bits of the current pass are extracted into the right most positions of the destination buffer. In another embodiment, the selected bits of a current pass are concatenated with the previously extracted bits into another buffer using shift and logic operations.

The process repeats itself until the destination buffer has been filled with bits from the desired bit plane, or an alternative limit has been reached. For example, one embodiment may store two desired bit planes in a buffer. In such an embodiment, the bit extraction process would repeat itself until it as filled the segment of the buffer allocated for the first desired bit plane. In another embodiment, the multiple bit planes may be extracted from a data stream. Multiple masking bits may be set. The data bits corresponding to a first masking bit may be extracted into a first destination buffer while the data bits corresponding to a second masking bit may be extracted into a second destination buffer.

In addition, FIG. 5 illustrates consistent positions for masking bits corresponding to a selected bit plane. In an alternative embodiment, the bits for a given bit plane may not be located at the same position throughout a data stream. Hence, locations of masking bits may vary with the locations of bits of a selected bit plane.

Figure 6:
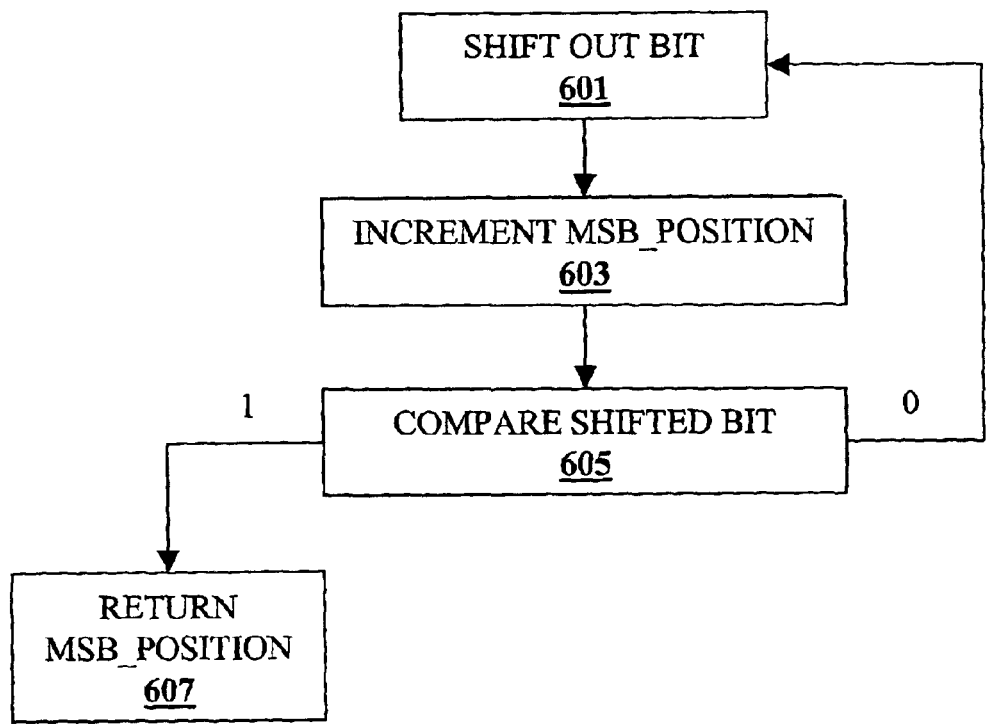
FIG. 6 is a flow chart for locating the MSB with shift and compare operations according to one embodiment of the invention.

FIG. 6 is a flow chart for locating the MSB with shift and compare operations according to one embodiment of the invention. At block 601, a bit is shifted out of a buffer hosting a bit plane. At block 603, a variable indicating the MSB's position ("MSB_POSITION") is incremented. At block 605, the shifted bit is compared. A zero bit causes control to flow to block 601. A one bit causes the MSB_POSITION to be returned at block 607.

Figure 7A:
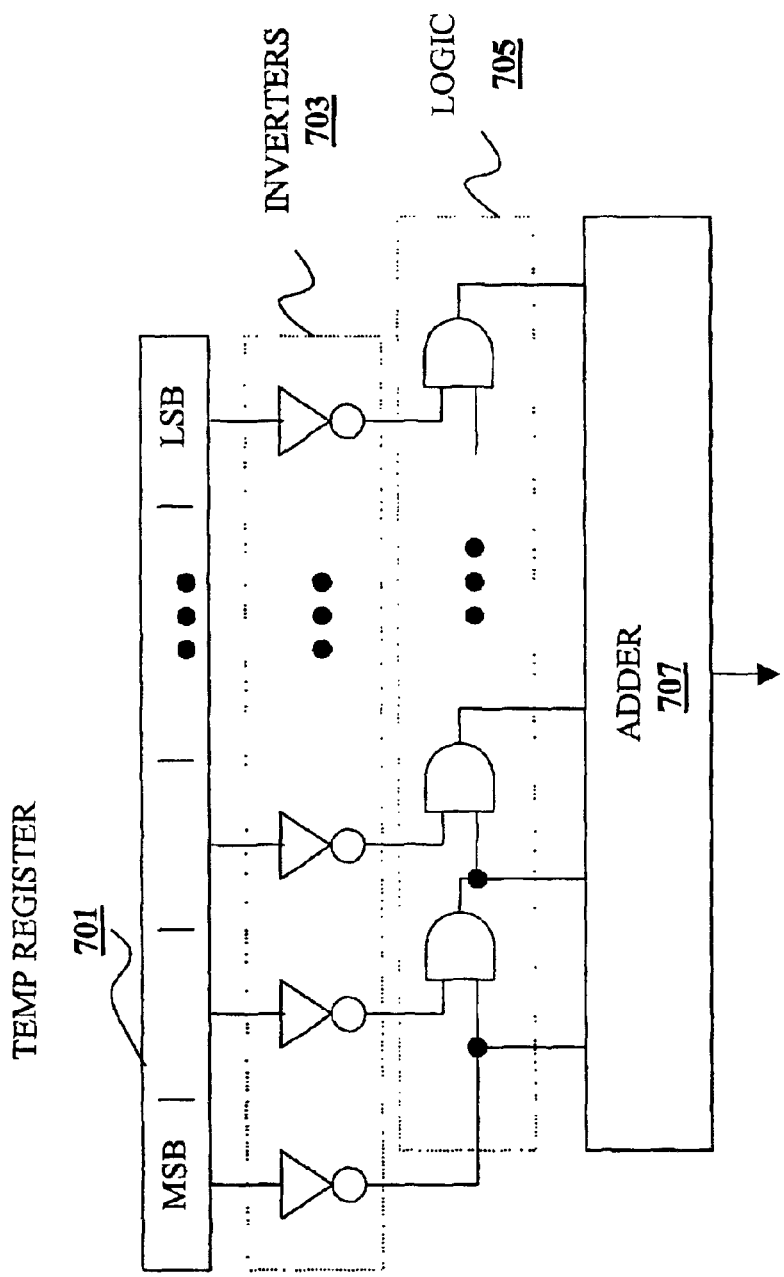
FIG. 7A is an exemplary diagram illustrating components for locating the MSB of a register with daisy-chaining according to one embodiment of the invention.

FIG. 7A is an exemplary diagram illustrating components for locating the MSB of a register with daisy-chaining according to one embodiment of the invention. In FIG. 7A, a bit plane is stored in a temp register 701. The temp register 701 is coupled with set of logic 703 to invert the bits of bit plane ("inverter logic"). The inverter logic 703 is coupled with a set of logic 705. The set of logic 705 is coupled with an adder 707. The bit plane that is stored in the temp register 701 is driven into the inverter logic 703. The inverter logic 703 flips all of the bits in the bit plane. The flipped bits of the bit plane then flow into the set of logic 705. The set of logic 705 cause all of the bits after the leftmost one bit to be set to zero (0). The modified bits of the bit plane flow from the set of logic 705 to the adder 709. The adder 707 adds the modified bit plane bits in an adder tree and generates a result, which is the MSB_POSITION. The generated result indicates the position of the MSB with respect to the leftmost bit.

Figure 7B:
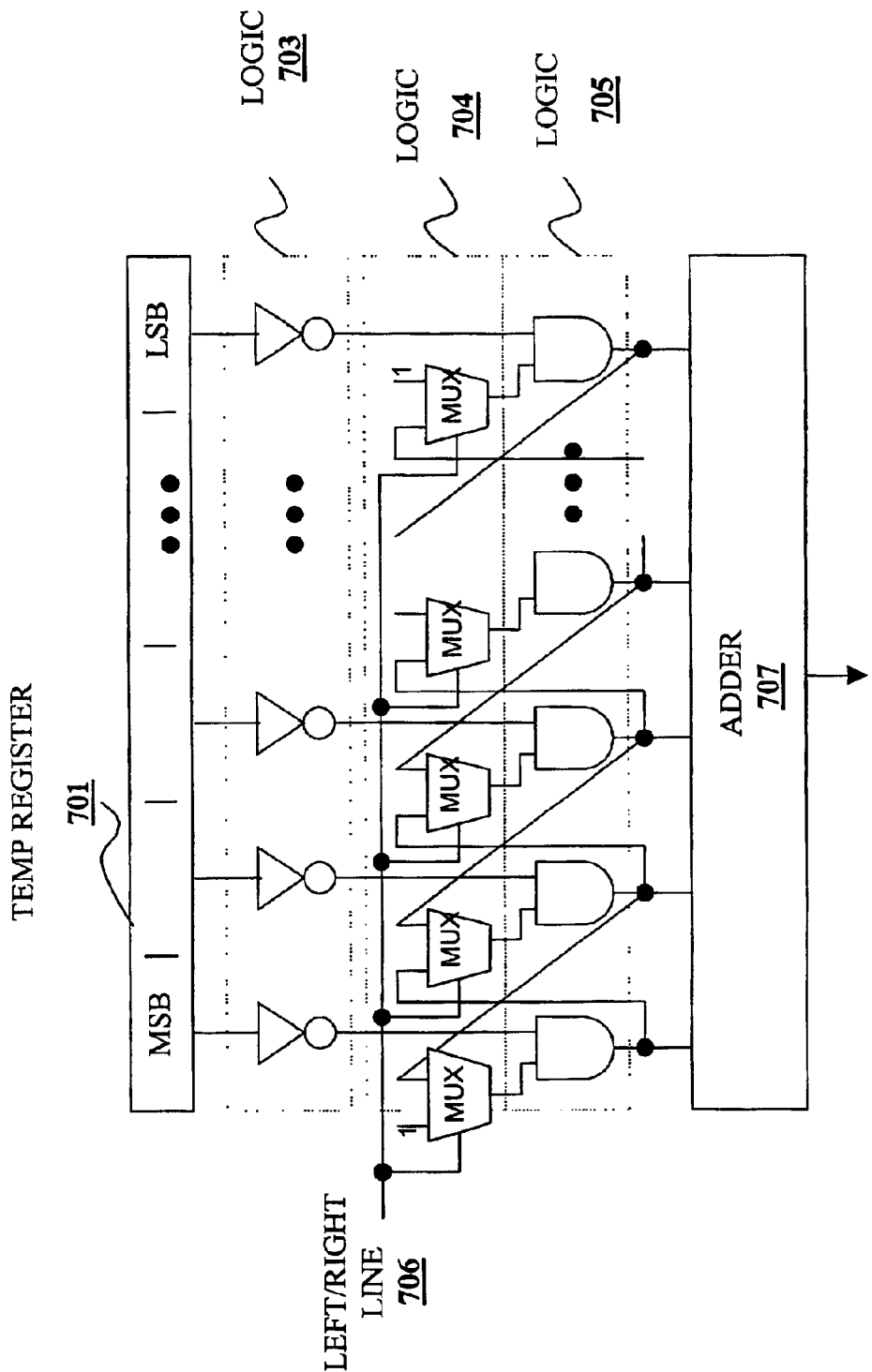
FIG. 7B is an exemplary diagram illustrating components for locating the MSB of a register with daisy-chaining according to another embodiment of the invention.

FIG. 7B is an exemplary diagram illustrating components for locating the MSB of a register with daisy-chaining according to another embodiment of the invention. In FIG. 7B, the temp register 701 is coupled with the inverter logic 703, similar to FIG. 7A. The inverter logic 703 is coupled with multiplexing logic 704. The multiplexing logic 704 is coupled with the set of logic 705. As in FIG. 7A, the set of logic 705 is coupled with the adder 707. After the inverter logic 703 inverts the bits of the bit plane driven from the temp register 701, the inverted bits flow into the multiplexing logic 704. The multiplexing logic 704 also receives selection input from a line 706 that indicates whether the MSB is to be found with respect to the leftmost bit or the rightmost bit.

While FIGS. 7A–7B illustrate inverters and AND gates, it should be understood that such logic is exemplary (e.g., alternative embodiments may perform different logical operations and implement different logic for daisy chaining).

Figure 8:
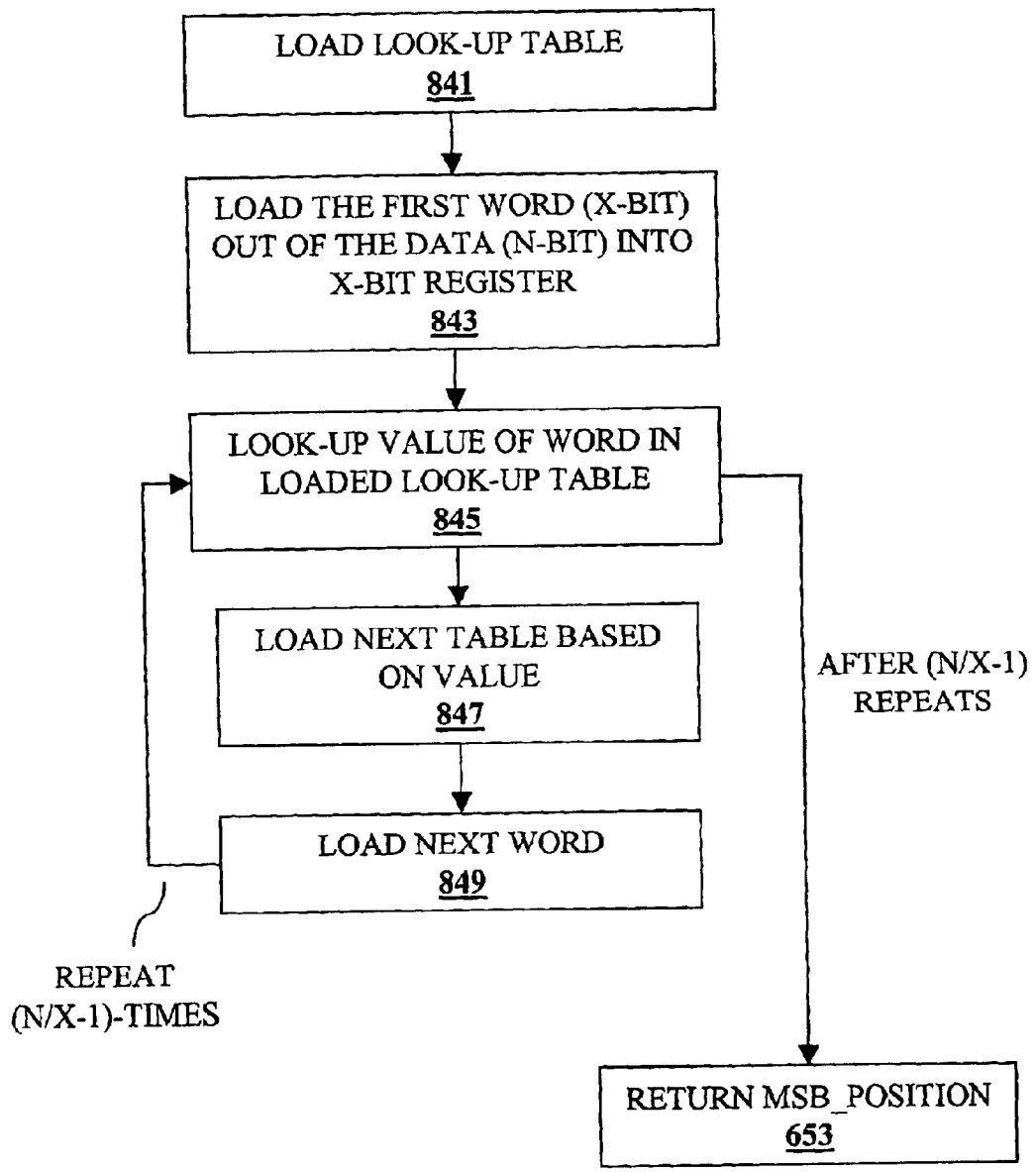
FIG. 8 is a flowchart for locating the MSB in a register with one or more look-up tables according to one embodiment of the invention.

FIG. 8 is a flowchart for locating the MSB in a register with one or more look-up tables according to one embodiment of the invention. At block 841, a look-up table is loaded. At block 843, a word (X-bits) of N bits of data into an x-bit register is loaded. At block 845, a value corresponding to the word in the loaded look-up table is looked-up. At block 847, the next look-up table is loaded in accordance with the value. In one embodiment, while a corresponding zero value in the look-up table causes the same look-up table to be loaded, a corresponding non-zero value causes a different look-up table to be loaded. At block 849, the next word of the selected bit plane is loaded. The operations of block 845, block 847, and block 849 are repeated until the selected bit plane has been processed (i.e., operations are repeated N/x−1 times). After (N/X−1) iterations, block 853 returns the MSB_POSITIONS based on the sum of the values from the table lookups.

Locating a MSB in a buffer with look-up tables may be implemented in a variety of ways. Different implementations of locating the MSB with look-up tables relate to desired results with factors such as memory limitations, speed, etc. Various implementations of locating the MSB in a buffer may differ in relation to which words are loaded first, the most significant or the least significant, the size of the data, and/or the size of the words.

While the flow diagrams in the Figures show a particular order of operations performed by certain embodiments of the invention, it should be understood that such order is exemplary (e.g., alternative embodiments may perform certain of the operations in a different order, combine certain of the operations, perform certain of the operations in parallel, etc.). For example, while the flow diagrams in the Figures show finding MSB of a particular buffer and encoding the symbol one after another, an alternative embodiment is to find multiple MSBs and encode the symbols simultaneously.

Various applications that use variable length coding may be optimized with the described invention. Variable length coding for image compression, audio compression, and streaming video are a few examples of applications that may benefit from the described invention. Reducing mispredicted branches from a processor's pipeline also increases the overall efficiency of the processor since cycles of the processor may be used for other tasks.

While the invention has been described in terms of several embodiments, those skilled in the art will recognize that the invention is not limited to the embodiments described. For example, although several embodiments have been described with respect to bits, other embodiments may apply the described method and apparatus to symbols, which are represented by one or more bits. The method and apparatus of the invention may be practiced with modification and alteration within the spirit and scope of the appended claims. The description is thus to be regarded as illustrative instead of limiting on the invention.

What is claimed is:

1. A method comprising:
   receiving a group bit plane data having a group of set values;
   identifying a group of most significant set bit (MSB) positions of the group of set values within the group of bit plane data; and
   for each of the group of MSB positions, encoding a run of non-set values preceding each of the group of MSB positions.

2. The method of claim 1 further comprising encoding a second run of non-set values with an ending symbol.

3. The method of claim 1 further comprising encoding a group of signs corresponding to the group of set values.

4. The method of claim 1 wherein the group of MSB positions are identified without non-loop related conditional branches.

5. The method of claim 4 wherein identifying the group of MSB positions without non-loop related conditional branches comprises:
   performing a logic operation of each value in the group of bit plane data; and
   tracking the group of MSB positions with a result of the logic operation.

6. The method of claim 4 wherein the identifying the group of MSB positions without non-loop related conditional branches comprises:
   performing a logic operation of each value in the group of data;
   setting a flag to a result of the logic operation; and
   tracking the group of MSB positions using a conditional instruction with the flag.

7. A method comprising:
   loading a group of bit plane data into a buffer, the group of bit plane data having a group of one or more set bits;
   identifying a position of a first set bit in the buffer without non-loop related conditional branching;
   encoding a run of non-set bits preceding the position; and
   shifting the run of non-set bits and the first set bit out of the buffer.

8. The method of claim 7 further comprising encoding a second run of set values with an ending symbol.

9. The method of claim 7 further comprising encoding a sign bit corresponding to the first set bit at the position in a second buffer.

10. The method of claim 7 wherein loading the group of bit plane data into the buffer comprises:
    loading a group of source data into a first buffer, the group of source data including the group bit plane of data;
    loading a mask for a bit-plane into a second buffer;
    selecting the group of bit plane data from the group of source data with the mask; and
    extracting the group of bit plane data into the buffer.

11. The method of claim 7 wherein identifying the first set bit comprises:
    shifting each bit of the group of bit plane data out of the buffer;
    comparing each shifted bit with a compare bit to determine if each bit is one of the group of set bits;
    tracking each of the group of set bits when detected with the comparing; and
    incrementing a counter for each shifted bit.

12. The method of claim 7 wherein the first set bit is identified with one or more look-up tables.

13. The method of claim 7 further comprising:
    identifying multiple positions of first set bits in the buffer without non-loop related conditional branching; and
    simultaneously encoding runs of non-set bits preceding the positions.

14. An apparatus comprising:
    a buffer to host a group of bit plane data having a group of one or more set bits; and
    a variable length coding (VLC) module coupled with the memory, the VLC module to identify the group of set bits' positions and to encode each run of non-set bits with respect to the group of set bits' positions.

15. The apparatus of claim 14 further comprising the VLC module to encode a second run of non-set bits with an ending symbol.

16. The apparatus of claim 14 further comprising the VLC module to encode a group of sign bits corresponding to the group of set bits.

17. The apparatus of claim 14 further comprising a group of one or more look-up tables for the VLC module to identify the group of set bits' positions.

18. The apparatus of claim 14 wherein the VLC module to identify each of the group of set bits' positions comprises:
    for each of the group of set bits,
       to load the group of bit plane data into a memory,
       to flip all bits of the group of bit plane data,
       to set all bits in positions after one of the group of set bits position to
    non-set bits, and
       to add the set bits in the memory in an adder tree.

19. A machine-readable medium that provides instructions, which when executed by a set group of processors of one or more processors, cause said group of processors to perform operations comprising:
    receiving a group of bit plane data having a group of set values;
    identifying a group of most significant set bit (MSB) positions of the group of set values within the group of bit plane data; and
    for each of the group of MSB positions, encoding a run of non-set values preceding each of the group of MSB positions.

20. The machine-readable medium of claim 19 further comprising encoding a second run of non-set values with an ending symbol.

21. The machine-readable medium of claim 19 further comprising encoding a group of signs corresponding to the group of set values.

22. The machine-readable medium of claim 19 wherein the group of MSB positions are identified without non-loop related conditional branches.

23. The machine-readable medium of claim 22 wherein identifying the group of MSB positions without non-loop related conditional branches comprises:
 performing a logic operation of each value in the group of bit plane data; and
 tracking the group of MSB positions with a result of the logic operation.

24. The machine-readable medium of claim 22 wherein the identifying the group of MSB positions without non-loop related conditional branches comprises:
 performing a logic operation of each value in the group of bit plane data;
 setting a flag to a result of the logic operation; and
 tracking the group of MSB positions using a conditional instruction with the flag.

25. A machine-readable medium that provides instructions, which when executed by a set group of processors of one or more processors, cause said set of processors to perform operations comprising:
 loading a group of bit plane data into a buffer, the group of bit plane data having a group of one or more set bits;
 identifying a position of a first set bit in the buffer without non-loop related conditional branching;
 encoding a run of non-set bits preceding the position; and
 shifting the run of non-set bits and the first set bit out of the buffer.

26. The machine-readable medium of claim 25 further comprising encoding a second run of set values with an ending symbol.

27. The machine-readable medium of claim 25 further comprising encoding a sign bit corresponding to the first set bit at the position in a second buffer.

28. The machine readable medium of claim 25 wherein loading the group of bit plane data into the buffer comprises:
 loading a group of bit plane source data into a first buffer, the group of source data including the group of bit plane data;
 loading a mask for a bit-plane into a second buffer;
 selecting the group of bit plane data from the group of source data with the mask; and
 extracting the group of bit plane data into the buffer.

29. The machine-readable medium of claim 25 wherein identifying the first set bit comprises:
 loading the group of bit plane data into a memory;
 flipping all bits of the group of bit plane data;
 setting all bits after the first zero bit to zero; and
 adding the set bits in the second memory in an adder tree, the set bits being one bits.

30. The machine-readable medium of claim 25 wherein the first set bit is identified with one or more look-up tables.

* * * * *

UNITED STATES PATENT AND TRADEMARK OFFICE
CERTIFICATE OF CORRECTION

PATENT NO. : 6,798,364 B2
DATED : September 28, 2004
INVENTOR(S) : Chen et al.

It is certified that error appears in the above-identified patent and that said Letters Patent is hereby corrected as shown below:

Column 7,
Line 17, after the first occurrence of "group", insert -- of --.
Line 45, before "data", insert -- bit plane --.

Signed and Sealed this

Tenth Day of May, 2005

JON W. DUDAS
*Director of the United States Patent and Trademark Office*